United States Patent [19]

Wellhöefer et al.

[11] 4,450,471

[45] May 22, 1984

[54] SEMI-CONDUCTOR POWER DEVICE ASSEMBLY AND METHOD OF MANUFACTURE THEREOF

[75] Inventors: Felicitas Wellhöefer, Birmingham, England; David W. Stacey, deceased, late of Birmingham, England; by Lesley A. Stacey, legal representative, Solihull, England

[73] Assignee: Lucas Industries Limited, Birmingham, England

[21] Appl. No.: 272,960

[22] Filed: Jun. 12, 1981

[30] Foreign Application Priority Data

Jun. 21, 1980 [GB] United Kingdom ............... 8020407

[51] Int. Cl.³ .................. H01L 23/14; H01L 23/34
[52] U.S. Cl. ........................... 357/80; 357/81; 29/590
[58] Field of Search ............. 357/81, 80; 29/589, 29/590; 427/88

[56] References Cited

U.S. PATENT DOCUMENTS 3,290,564 12/1966 Wolff .............................. 357/80
4,356,505 10/1982 Lovinger et al. ................ 29/590

Primary Examiner—James W. Davie
Attorney, Agent, or Firm—Holman & Stern

[57] ABSTRACT

A heat spreader has a thin ceramic layer plasma sprayed onto its lower surface which may be chamfered. The upper surface of the spreader is then plated with a thin nickel or gold layer and a semi-conductor power device is soldered to the latter. The spreader is then secured via the ceramic layer to a base material serving as a heat sink by a layer of epoxy resin loaded with silver particles. The thin ceramic layer electrically insulates the spreader from the base material but enables heat conduction therebetween. The application of the plasma sprayed ceramic layer to the spreader is easy and economical to effect.

10 Claims, 2 Drawing Figures

SEMI-CONDUCTOR POWER DEVICE ASSEMBLY AND METHOD OF MANUFACTURE THEREOF

FIELD OF THE INVENTION

This invention relates to a semi-conductor power device assembly and a method of manufacturing same.

BACKGROUND OF THE INVENTION

It has been previously proposed to provide a semi-conductor power device assembly in which the power device is thermally coupled to but electrically insulated from a base material by providing an alumina tile between the device and the base material, the alumina tile being metallised on one or both sides so as to enable it to be soldered to a heat spreader and being secured at its other side to the base material. The power device is soldered to the heat spreader. In order to ensure that there is a good thermal conduction between the power device and the base material, which is used as a heat skin, it is necessary for the solid alumina tile to be as thin as possible. It will be appreciated that the assembly process is relatively expensive and complicated because two soldering operations are required in addition to the securing of the assembly of power device, heat spreader and tile to the base material. Additionally, the tile is relatively expensive and is relatively fragile, thus further increasing costs and leading to handling problems in production.

SUMMARY OF THE INVENTION

It is therefore an object of the present invention to provide a semi-conductor power device assembly in which the above-mentioned problems are obviated or mitigated.

According to the present invention, there is provided a semi-conductor power device assembly comprising a semi-conductor power device which is secured to a heat spreader backed by a ceramic layer which has been sprayed onto the heat spreader, and means bonding the ceramic layer to a base material.

Also according to the present invention, there is provided a method of manufacturing a semi-conductor power device assembly as described in the last preceding paragraph, comprising the steps of spraying a ceramic layer onto a heat spreader and subsequently securing a semi-conductor power device to the heat spreader and bonding a base material to the ceramic layer.

Typically, the thickness of the sprayed ceramic layer is up to 0.25 mm. However, the actual thickness chosen will depend upon the thermally conducting and electrically insulating properties of the particular ceramic chosen. For example, if a standard aluminium oxide coating is chosen, the thickness of the coating will be about 0.15 mm in the case where the insulation is to be effective against voltages of up to 500 volts. For voltages up to 300 volts, the standard aluminium oxide layer need only be 0.1 mm thick.

As an alternative to using aluminium oxide, other oxide ceramics can be employed, e.g. $ZrO_2$, $TiO_2$ and MgO. Alternatively, nitride ceramics such as $Si_3N_4$ can be employed.

Typically, the material being sprayed has a particle size in the range of 5 to 45 micrometers. With particle sizes which are greater than this range, there is a risk that, at least with thinner coatings, the coating will be unacceptably porous.

It is particularly preferred for the ceramic layer to be bonded to the base material over a portion of the former which is spaced inwardly, preferably by not less than 1 mm, from the peripheral edge of the coating. This is because, particularly with smaller coating thicknesses, there is a tendency for hairline cracks to exist at the edge of the ceramic coating so that when the layer is bonded to the base material, some of the bonding material may enter such cracks and form a bridge between the base material and the heat spreader. Additionally or alternatively, some of the bonding material may be squeezed out so that it builds up on the edges of the ceramic layer and forms a direct bridge between the heat spreader and the base material. It is to be appreciated that the bonding agent, because it is required to be a good thermal conductor, will generally also be an electrical conductor.

Typically, the bonding agent used to secure the ceramic layer to the base material is an epoxy resin loaded with heat conductive particles, e.g. silver particles. Alternatively, all or part of the ceramic layer may be coated with a solderable metal layer, for example by wire spraying or by radio frequency ion plating, for example with copper and/or nickel, the layer then being bonded to the base material by soldering.

In the case where a loaded epoxy resin is employed, it is particularly preferred to cure the epoxy resin as soon as possible after applying it to the ceramic in order to limit diffusion of the uncured resin which would reduce the mechanical strength of the joint.

In order to prevent the aforesaid problems of bridging of the heat spreader and base material by the bonding agent, the heat spreader itself may be provided with chamfered edges and the ceramic coating provided over the base of the heat spreader including the chamfered edges so that the ceramic material over the chamfered edges is spaced from the base material and takes no part in the bond which is effected between the ceramic layer and the base material. Alternatively, the base material may be provided with a raised portion which has a smaller surface area than the surface area of the coating, and the bond is effected between this raised portion of the base material and a region of the ceramic coating which is spaced inwardly of the periphery thereof.

It is, of course, necessary for the surface portion of the ceramic layer to follow as closely as possible the portion of the base material to which it is being bonded. Typically, the surface portions of the parts to be bonded together are flat. This can be effected by clamping the heat spreader against a flat surface during spraying of the ceramic layer thereon and during any previous cleaning operation thereon (eg., during grit blasting).

The spraying technique used to apply the ceramic coating is typically a plasma spraying operation as such an operation can be fully automated and continuously monitored to meet the requirements of quality and reliability control in a production line. Considerable savings of ceramic material can be obtained by disposing a large number of heat spreaders in close proximity and performing the spraying operation on such heat spreaders. This is a less wasteful technique than plasma spraying a ceramic coating on selected areas of the base material where wastage of the ceramic material occurs because of the necessary masking of portions of the base material not required to be covered.

Embodiments of the present invention will now be described, by way of example, with reference to the accompanying drawing, in which:

DETAILED DESCRIPTION OF THE INVENTION

Figure 1:
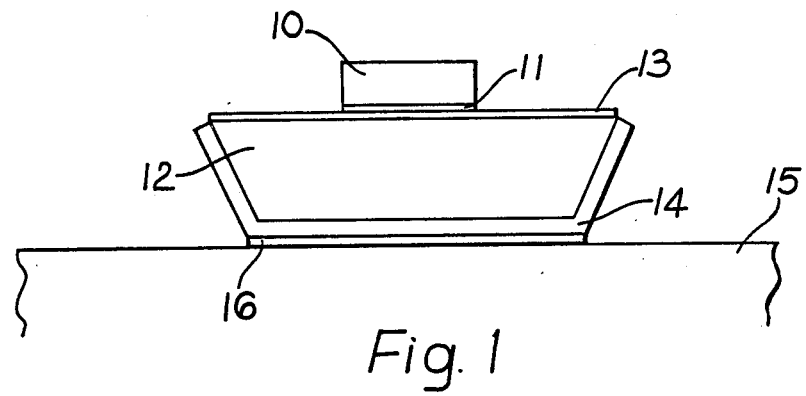
FIG. 1 is a schematic view of a semi-conductor power device assembly according to one embodiment of the present invention.

Referring now to FIG. 1 of the drawing, the assembly comprises a semi-conductor power transistor chip 10 which is attached by means of a solder layer 11 to a copper heat spreader 12. The heat spreader 12 is plated on its upper surface with a thin gold or nickel plate layer 13. The thickness of the plate layer 13 is typically 3 microns and is provided in order to improve the solderability of the copper heat spreader 12 over a period of time. The heat spreader 12 has a lower surface which is chamfered and which has a ceramic layer 14 of aluminium oxide applied thereto by a plasma spraying operation. The ceramic layer 14 extends over the chamfered edges of the heat spreader 12. The aluminium oxide (ceramic) layer 14 is bonded to a copper base material or heat sink 15 by a bonding layer 16 of epoxy resin loaded with silver particles to render the layer 16 thermally conductive. The surface portion of the base material 15 to which the ceramic layer 14 is bonded is planar, as is that portion of the ceramic layer 14 which is bonded to the base material 15. The portions of the ceramic layer coating 14 which extend over the chamfered edges of the heat spreader ceramic layer 14 are spaced from the base material 15 and take no part in the bonding of the layer 14 ceramic to the base material 15. Thus, the region of the layer bonding 14 which is bonded to the base material 15 via the layer ceramic 16 is disposed inwardly of the periphery of the layer 14. This is provided for the reasons previously mentioned.

The above-described assembly is manufactured by grit blasting the heat spreader 12 so as to clean it and then plasma spray coating the aluminium oxide ceramic layer 14 thereon. Following this, the gold or nickel plate layer 13 is applied thereto by a wet electro-plating process. The application of the ceramic layer 14 before the plate layer 13 effectively masks those surfaces of the heat spreader 12 which are not to be coated with the relatively costly gold or nickel plate layer 13. Thus, wastage of the gold or nickel is minimised.

The aluminium oxide powder used in the plasma spraying operation is a standard grade which is conventionally used as a coating material in wear protection applications. However, the aluminium oxide powder chosen is one which has a particle size in the range of 5 to 45 microns to ensure that the coating is dense and sufficiently non-porous at least in the region of the ceramic layer 14 which is to be bonded to the base material 15 by the layer bonding 16.

After formation of the plate layer 13, the semi-conductor power transistor chip 10 is soldered to the plate layer 13.

Following this, the heat spreader 12 is pressed with its ceramic coating layer 14 against the bonding layer 16 which has been previously applied by a screen printing technique to the base material 15. Immediately after engagement of the coating layer 14 with the bonding layer 16, the layer is cured to prevent undue diffusion of the uncured bonding layer 16 into the ceramic coating layer 14.

Figure 2:
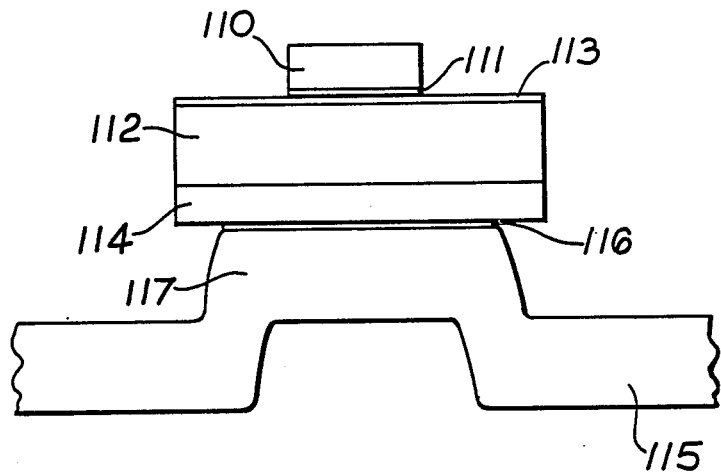
FIG. 2 is a schematic view of a semi-conductor power device assembly according to another embodiment of the present invention.

Referring not to FIG. 2 of the drawing, the assembly illustrated therein is similar to that of FIG. 1 and similar parts are accorded the same reference numeral but prefixed by the numeral 1. In this embodiment, the heat spreader 112 does not have chamfered edges so that the ceramic layer 114 is completely planar. However, as will be seen from FIG. 2, the base material 115 has been subjected to a coining operation so as to form a raised portion 117 which has an upper surface of a smaller cross-sectional area than that of the heat spreader 112. The (epoxy resin) bonding layer 116 is applied to this upper surface of the raised portion 117 and the heat spreader 112 is positioned so that the layer 116 contacts only a portion of the ceramic coating layer 114 which is spaced inwardly of the periphery of the coating layer. Solder layer 111 and plate layer 113 are similar to the embodiment of FIG. 1.

The assembly sequence for the above-described semi-conductor power device assembly is the same as that described with reference to FIG. 1.

In a typical embodiment, the base material 15 was provided as a TO3 header. The heat spreader 12 was a copper pad having 45° chamfered edges. The insulation layer had a thickness of 0.15 mm and was applied by a plasma spray process using a Metco P105 5F-14 plasma spray as supplied by Metco Inc. The bonding layer 16 was an electroless nickel plated layer having a thickness of 12 micrometers. The chip 10 was a PL40 HVD chip which was soldered to the layer 13 by means of (95/5) H.M.P. Ersin Multicore solder wire (s.w.g. 16).

The epoxy resin employed was EPO-TEK H20E, a silver-loaded two-component epoxy resin as sold by Epoxy Technology Inc., U.S.A. The thickness of the bonding layer 16 was 0.08 mm and the assembly of heat spreader 12 and chip 10 was applied to the bonding layer 16 by finger tip pressure. The epoxy resin was oven cured for 15 minutes at 150° C.

Semi-conductor power device assemblies of the above-described type have successfully passed a test comprising subjecting the assemblies to thermal shock cycling (1000 cycles-15° to 120° C.) and insulation tests (500 volts minimum), and were found to be as effective as semi-conductor power device assemblies of the above described type using solid alumina tiles.

In the above described embodiments, the heat spreaders 12 and 112 were sufficiently thick as to remain undistorted throughout the grit blasting and plasma deposition operations. However, if distortion provides problems, it is within the scope of the present invention to clamp the heat spreader during such operations to ensure that proper bonding to the base material can subsequently be made.

We claim:

1. In an assembly containing a semi-conductor power device and a base material heat sink, the improvement comprising:
    a heat spreader interposed between said power device and said base material;
    a ceramic, electrically insulating, heat conducting, layer spray-bonded to the bottom of the heat spreader;
    an electrically conducting and heat conducting bonding layer means for bonding the base material to the ceramic layer;

a thin metallic plate layer bonded to the top of the heat spreader; and a solder layer bonding the metallic plate layer to the semi-conductor power device.

2. The assembly according to claim 1, wherein the bonding layer by which the ceramic layer is bonded to the base material is spaced inwardly from a peripheral edge of the ceramic layer over a portion thereof.

3. The assembly according to claim 2, wherein said heat spreader has a base provided with chamfered edges which are spaced from said base material and said ceramic layer extends over said base including said chamfered edges.

4. The assembly according to claim 2, wherein said base material has a raised portion having a smaller surface area than the surface area of said ceramic layer, and wherein the bond is effected between said raised portion and said portion of said ceramic layer which is spaced inwardly from the peripheral portion thereof.

5. The assembly according to claim 1, wherein said bonding layer comprises a resin loaded with heat-conductive particles.

6. The assembly according to claim 1, wherein said bonding layer comprises a solder bonded to said base material and to a solderable metal layer applied to said ceramic layer.

7. The assembly according to claim 1, wherein said ceramic layer is a plasma sprayed layer.

8. A method of manufacturing an assembly containing a semi-conductor power device and a base material heat sink having an improvement wherein: a heat spreader is interposed between said power device and said base material; a ceramic, electrically insulating, heat conducting, layer is spray-bonded to the bottom of the heat spreader; an electrically conducting and heat conducting bonding layer means bonds the base material to the ceramic layer; a thin metallic plate layer is bonded to the top of the heat spreader; and a solder layer bonds the metallic plate layer to the semi-conductor power device; said method comprising the non-sequential steps of:

spraying the ceramic layer onto a bottom surface of the heat spreader;

bonding the thin metallic plate layer to the top surface of the heat spreader;

bonding the semi-conductor power device to the metallic layer by means of the solder layer; and bonding the base material heat sink to the bonded ceramic layer by means of a bonding layer.

9. The method according to claim 8, wherein surface portions of the base material and the heat spreader to be bonded together are flat, and the method further includes the step of clamping the heat spreader against a flat surface during the spraying step.

10. The method according to claim 8 or 9, for producing a plurality of assemblies, wherein the spraying step is effected on a plurality of heat spreaders disposed in close proximity.

* * * * *